United States Patent
Yang et al.

(10) Patent No.: US 9,386,720 B2
(45) Date of Patent: Jul. 5, 2016

(54) CASING ASSEMBLY AND POWER SUPPLY APPARATUS WITH THE SAME

(71) Applicant: DELTA ELECTRONICS, INC., Taoyuan Hsien (TW)

(72) Inventors: Ming-Tang Yang, Taoyuan Hsien (TW); Chen-Chiang Su, Taoyuan Hsien (TW)

(73) Assignee: DELTA ELECTRONICS, INC., Taoyuan Hsien (TW)

( * ) Notice: Subject to any disclaimer, the term of this patent is extended or adjusted under 35 U.S.C. 154(b) by 212 days.

(21) Appl. No.: 14/325,122

(22) Filed: Jul. 7, 2014

(65) Prior Publication Data
US 2015/0264831 A1  Sep. 17, 2015

(30) Foreign Application Priority Data
Mar. 13, 2014  (TW) .............................. 103108961 A (51) Int. Cl.
*H05K 7/14* (2006.01)
*G06F 1/18* (2006.01)
*H02G 3/14* (2006.01)
*H05K 5/00* (2006.01)

(52) U.S. Cl.
CPC .............. *H05K 7/1432* (2013.01); *H02G 3/14* (2013.01); *H05K 5/0013* (2013.01)

(58) Field of Classification Search
CPC ...... G06F 1/181; H02G 3/086; H05K 7/1432; H05K 5/0013
USPC ................... 174/50, 520, 559, 560, 561, 563; 361/752
See application file for complete search history.

(56) References Cited

U.S. PATENT DOCUMENTS

| | | | | |
|---|---|---|---|---|
| 5,383,098 A | * | 1/1995 | Ma ....................... | H04B 1/3833 174/371 |
| 5,613,237 A | * | 3/1997 | Bent ..................... | H04B 1/086 220/4.02 |
| 6,876,543 B2 | * | 4/2005 | Mockridge ......... | H04M 1/0249 361/752 |
| 7,004,614 B2 | * | 2/2006 | Tsai ..................... | G02B 6/0031 349/58 |
| 7,209,195 B2 | * | 4/2007 | Lin ................... | G02F 1/133308 349/58 |
| 7,429,700 B2 | * | 9/2008 | Kanamaru ........... | H01R 13/506 174/135 |

(Continued)

FOREIGN PATENT DOCUMENTS

| | | |
|---|---|---|
| TW | 393016 | 6/2000 |
| TW | M312698 | 5/2007 |

*Primary Examiner* — Adrian S Wilson
(74) *Attorney, Agent, or Firm* — Kirton McConkie; Evan R. Witt (57) ABSTRACT

A casing assembly includes a first casing and a second casing. The first casing includes a first lateral plate and a first engaging element. The first engaging element includes a first slab, a first sidewall and a second sidewall. The first sidewall and the second sidewall are connected with the first lateral plate. Moreover, a dent is formed between the first lateral plate and the first engaging element. The second casing is combined with the first casing. The second casing includes a second lateral plate and a second engaging element. The second engaging element includes a second slab, a third sidewall and a fourth sidewall. The third sidewall and the fourth sidewall are connected with the second lateral plate. The second engaging element is accommodated within the dent and in contact with the first engaging element, so that the first casing and the second casing are combined together.

20 Claims, 9 Drawing Sheets

(56) References Cited

U.S. PATENT DOCUMENTS

| | | | |
|---|---|---|---|
| 7,940,287 B2* | 5/2011 | Kim | G02F 1/133308 345/102 |
| 8,254,098 B2* | 8/2012 | Liu | H04M 1/0249 174/50 |
| 8,422,220 B2* | 4/2013 | Chen | E05C 19/06 361/679.58 |
| 8,480,186 B2* | 7/2013 | Wang | H05K 5/0013 312/223.1 |
| 2009/0175020 A1* | 7/2009 | Zadesky | G06F 1/1626 361/818 |
| 2010/0270305 A1* | 10/2010 | Yamamoto | B65D 43/0204 220/315 |

* cited by examiner

CASING ASSEMBLY AND POWER SUPPLY APPARATUS WITH THE SAME

FIELD OF THE INVENTION

The present invention relates to a casing assembly, and more particularly to a casing assembly that is assembled through engaging elements. The present invention also relates to a power supply apparatus with the casing assembly.

BACKGROUND OF THE INVENTION

Generally, an electronic device (e.g. a power supply apparatus or a server) has a casing assembly for accommodating and protecting a circuit board and electronic components. For combining two casing of the casing assembly together, plural screws are used to connect the two casing with each other. By sequentially tightening plural screws into predetermined screw holes of the two casings, the two casings can be securely combined together. As known, the process of assembling the conventional casing assembly is complicated and time-consuming, and the fabricating cost is high. Moreover, in case that the electronic components within the casing assembly need be repaired, the process of disassembling the casing assembly is also complicated and time-consuming.

Figure 1:
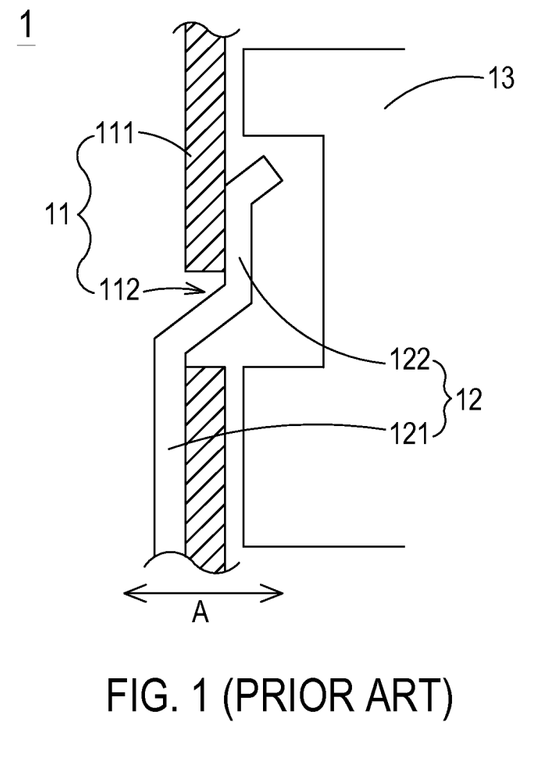
FIG. 1 is a schematic cross-sectional view illustrating a portion of a conventional casing assembly.

FIG. 1 is a schematic cross-sectional view illustrating a portion of a conventional casing assembly. As shown in FIG. 1, the casing assembly 1 comprises a first casing 11 and a second casing 12. The first casing 11 comprises a first lateral plate 111 and a slot 112. The slot 112 is formed in the first lateral plate 111. The second casing 12 comprises a second lateral pate 121 and a hook 122. After the hook 122 of the second casing 12 is penetrated through the slot 112 of the first casing 11, the first casing 11 and the second casing 12 are combined together, so that the casing assembly 1 is fabricated. However, the way of combining the first casing 11 and the second casing 12 by the engagement between the hook 122 and the slot 112 still has some drawbacks. For example, the engagement between the hook 122 and the slot 112 can only limit the horizontal movement of the first casing 11 and the second casing 12 along the normal line direction of the first lateral plate 111 and the second lateral pate 121 (i.e. the direction A as shown in FIG. 1). For limiting the horizontal movement of the first casing 11 and the second casing 12 along other two directions, the first casing 11 and the second casing 12 should be connected with each other through screws (not shown). Moreover, since only a single side of the hook 122 is connected with the second casing 12, the hook 122 cannot be securely fixed on the second casing 12. In other words, the hook 122 is readily suffered from deformation. Moreover, as shown in FIG. 1, the junction between the hook 122 and the slot 112 of the casing assembly 1 is very thick. For example, the thickness of the junction between the hook 122 and the slot 112 is about three times the thickness of the hook 122. After the casing assembly 1 is fabricated, the layout space for accommodating circuit board 13 and other electronic components (not shown) is restricted by the thickness of the junction between the hook 122 and the slot 112. For example, the circuit board 13 is usually equipped with a notch corresponding to the junction between the hook 122 and the slot 112. Due to the notch, the circuit board 13 is not in direct contact with the casing assembly 1. Alternatively, an insulating plate (not shown) is additionally arranged between the electronic components and the first lateral plate 111 (and the second lateral pate 121) in order to maintain electrical safety.

From the above discussions, a large number of screws are required to securely combine the first casing 11 and the second casing 12 of the conventional casing assembly 1 together. Consequently, the processes of assembling and maintaining the casing assembly 1 are time-consuming and troublesome. Moreover, the hook 122 of the casing assembly 1 is easily suffered from deformation. Moreover, the layout space of the conventional casing assembly 1 is restricted by the thickness of the junction between the hook 122 and the slot 112. Consequently, it is difficult to minimize the electronic device.

Therefore, there is a need of providing a casing assembly in order to eliminate the above drawbacks.

SUMMARY OF THE INVENTION

The present invention provides a casing assembly and a power supply apparatus employing the casing assembly for restricting the movement of a first casing and a second casing along two directions by engagements of the engaging elements, so that the number of screws is reduced and the assembling process is simplified.

The present invention provides a casing assembly with two engaging elements and a power supply apparatus employing the casing assembly. The engaging elements can provide sufficient structural strength to withstand deformation. Since the space utilization of the casing assembly is enhanced, the volume of the electronic device can be effectively reduced.

In accordance with an aspect of the present invention, there is provided a casing assembly. The casing assembly includes a first casing and a second casing. The first casing includes a first lateral plate and a first engaging element. The first engaging element includes a first slab, a first sidewall and a second sidewall. The first sidewall and the second sidewall are connected with the first lateral plate. Moreover, a dent is formed between the first lateral plate and the first engaging element. The second casing is combined with the first casing and includes a second lateral plate and a second engaging element. The second engaging element includes a second slab, a third sidewall and a fourth sidewall. The third sidewall and the fourth sidewall are connected with the second lateral plate. The second engaging element is accommodated within the dent and in contact with the first engaging element, so that the first casing and the second casing are combined together.

In accordance with another aspect of the present invention, there is provided a casing assembly. The casing assembly includes a first casing and a second casing. The first casing includes a first lateral plate and a first engaging element. The first engaging element is concavely formed in the first lateral plate and includes a first slab and at least one first sidewall. The first sidewall is extended from the first slab and connected with the first lateral plate. Moreover, a dent is formed between the first lateral plate and the first engaging element. The second casing is combined with the first casing and includes a second lateral plate and a second engaging element. The second engaging element is protruded from the second lateral plate and includes a second slab and at least one second sidewall. The second sidewall is extended from the second slab and connected with the second lateral plate. The second engaging element is accommodated within the dent and in contact with the first engaging element, so that the first casing and the second casing are combined together.

In accordance with a further aspect of the present invention, there is provided a power supply apparatus. The power supply apparatus includes a circuit board and a casing assembly. The casing assembly has an accommodation space for accommodating the circuit board. The casing assembly includes a first casing and a second casing. The first casing includes a first lateral plate and a first engaging element. The first engaging element includes a first slab, a first sidewall and a second sidewall. The first sidewall and the second sidewall are connected with the first lateral plate. Moreover, a dent is formed between the first lateral plate and the first engaging element. The second casing is combined with the first casing and includes a second lateral plate and a second engaging element. The second engaging element includes a second slab, a third sidewall and a fourth sidewall. The third sidewall and the fourth sidewall are connected with the second lateral plate. The second engaging element is accommodated within the dent and in contact with the first engaging element, so that the first casing and the second casing are combined together.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2A:
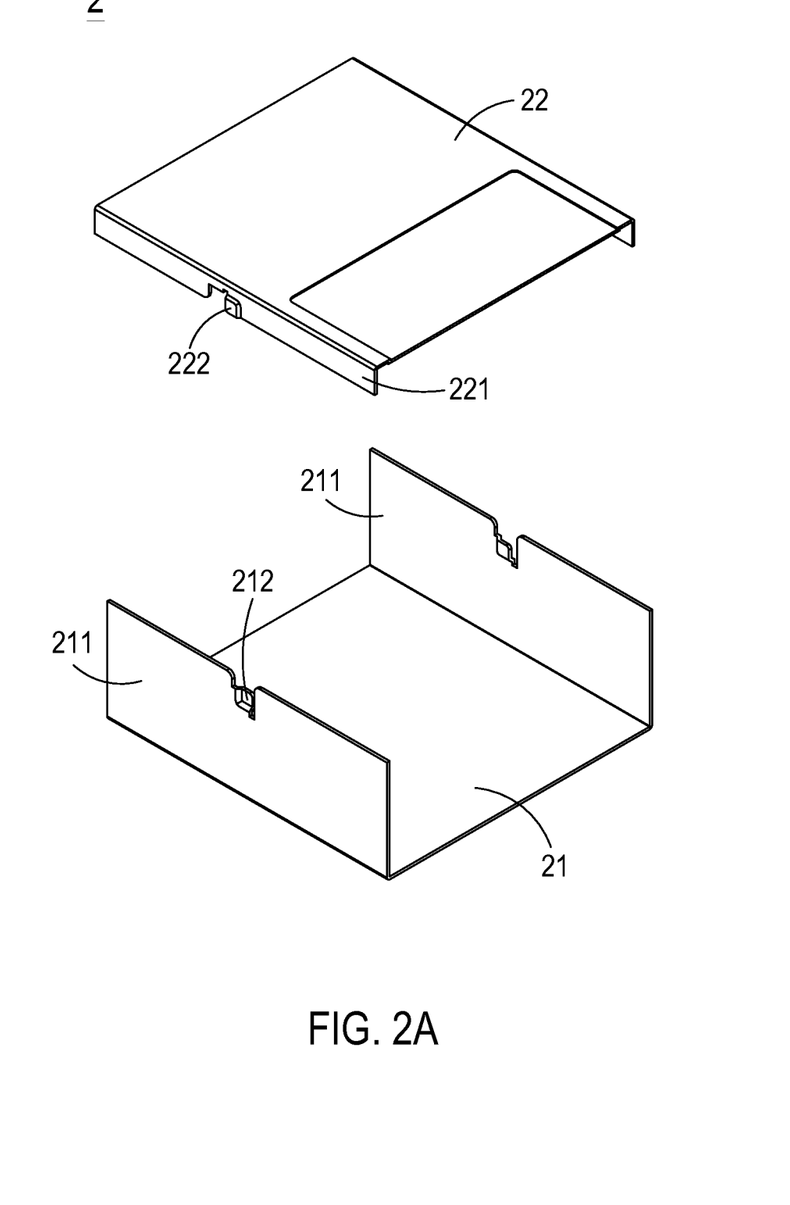
FIG. 2A is an exploded view illustrating a casing assembly according to an embodiment of the present invention.
Figure 2B:
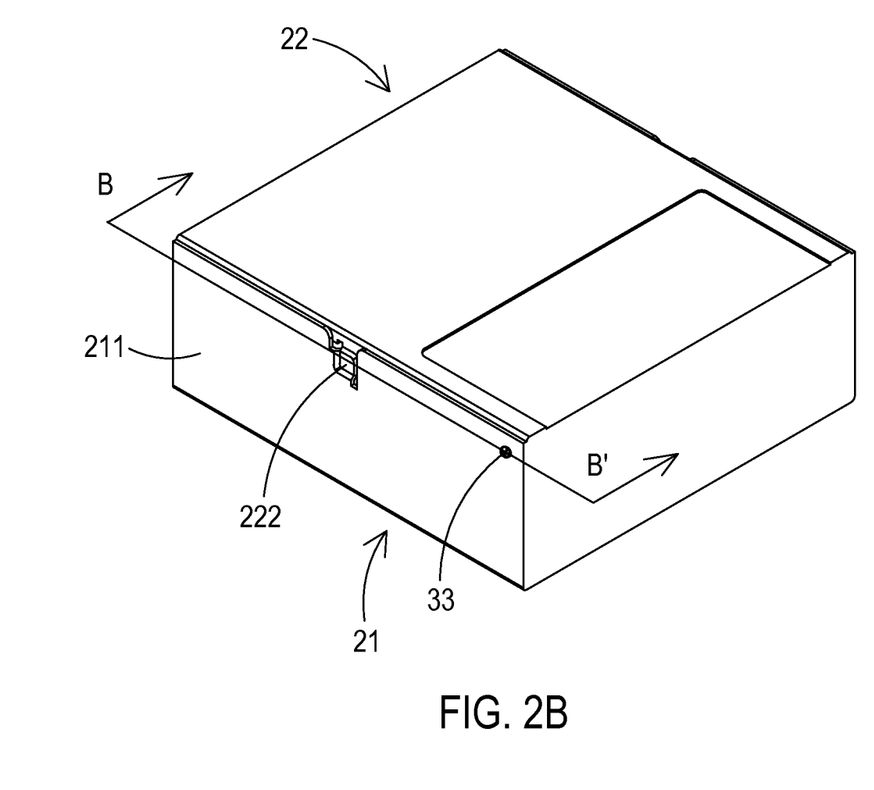
FIG. 2B is a schematic perspective view illustrating the casing assembly of FIG. 2A.
Figure 3:
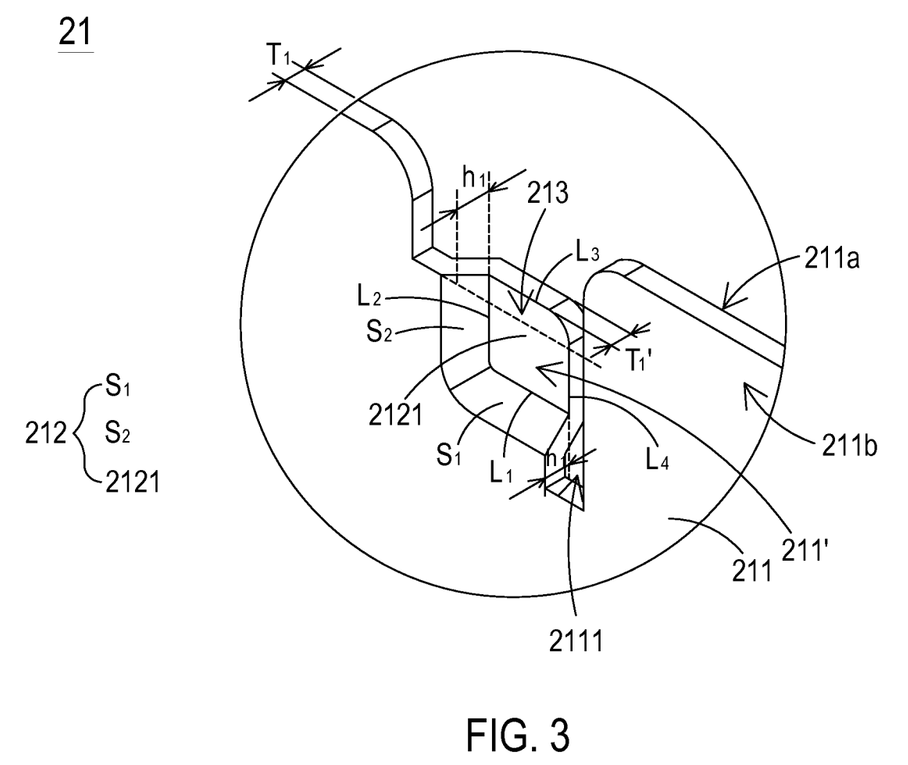
FIG. 3 is an enlarged fragmentary view illustrating a first engaging element of the casing assembly of FIG. 2.
Figure 4:
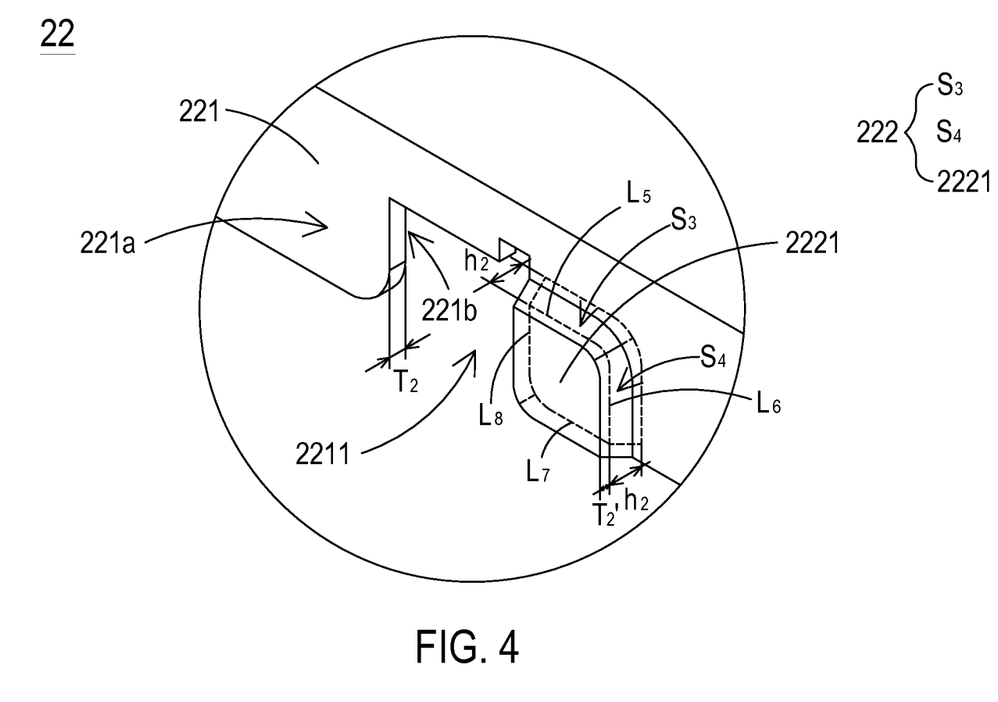
FIG. 4 is an enlarged fragmentary view illustrating a second engaging element of the casing assembly of FIG. 2.

FIG. 2A is an exploded view illustrating a casing assembly according to an embodiment of the present invention. FIG. 2B is a schematic perspective view illustrating the casing assembly of FIG. 2A. FIG. 3 is an enlarged fragmentary view illustrating a first engaging element of the casing assembly of FIG. 2. FIG. 4 is an enlarged fragmentary view illustrating a second engaging element of the casing assembly of FIG. 2. Please refer to FIGS. 2A, 2B, 3 and 4. The casing assembly 2 comprises a first casing 21 and a second casing 22. The first casing 21 comprises a first lateral plate 211 and a first engaging element 212. The first engaging element 212 is connected with the first lateral plate 211. In an embodiment, the first engaging element 212 is concavely formed in the first lateral plate 211. The first engaging element 212 comprises a first slab 2121, a first sidewall S1, and a second sidewall S2. The first sidewall S1 and the second sidewall S2 are extended from two adjacent edges of the first slab 2121 and connected with the first lateral plate 211. Moreover, a dent 213 is formed between the first lateral plate 211 and the first engaging element 212. Namely, the dent 213 is formed between a virtual extending plane 211' of the first sidewall 211 and the first slab 2121 of the first engaging element 212. The first casing 21 and the second casing 22 are combined together. The second casing 22 at least comprises a second lateral plate 221 and a second engaging element 222. The second engaging element 222 is connected with the second lateral plate 221. In an embodiment, the second engaging element 222 is protruded from the second lateral plate 221. The second engaging element 222 comprises a second slab 2221, a third sidewall S3, and a fourth sidewall S4. The third sidewall S3 and the fourth sidewall S4 are extended from two adjacent edges of the second slab 2221 and connected with the second lateral plate 221. For combining the first casing 21 with the second casing 22, the second engaging element 222 is accommodated within the dent 213 and in contact with first engaging element 212. The detailed structure of the casing assembly 2 will be illustrated as follows.

Please refer to FIG. 3. The first casing 21 comprises the first lateral plate 211 and the first engaging element 212. The first lateral plate 211 comprises a first surface 211a and a second surface 211b. The first surface 211a and the second surface 211b are opposed to each other. The first lateral plate 211 has a thickness T1. The first engaging element 212 comprises the first slab 2121, the first sidewall S1, and the second sidewall S2. The first slab 2121 is made of a rigid material, so that the first slab 2121 is not easily suffered from deformation. Moreover, the first slab 2121 is substantially a flat plate. The thickness T1' of the first slab 2121 is substantially equal to the thickness T1 of the first lateral plate 211. In this embodiment, the first slab 2121 of the first engaging element 212 is a rectangular slab with a first edge L1, a second edge L2, a third edge L3 and a fourth edge L4. The first edge L1 and the second edge L2 are located beside each other. The third edge L3 is opposed to the first edge L1. The fourth edge L4 is opposed to the second edge L2. It is preferred that the first slab 2121 is in parallel with the first lateral plate 211. It is noted that the shape of the first slab 2121 is not restricted. For example, in some other embodiments, the first slab 2121 has a polygonal shape or an irregular shape.

The first sidewall S1 and the second sidewall S2 of the first engaging element 212 are located beside each other. In addition, the height h1 of the first sidewall S1 is equal to the height h1 of the second sidewall S2. The first sidewall S1 and the second sidewall S2 are extended from the two adjacent edges L1 and L2 of the first slab 2121 and connected with the first lateral plate 211. Moreover, the first sidewall S1 and the second sidewall S2 are extended toward the first surface 211a of the first lateral plate 211. In other words, the first slab 2121, the first sidewall S1, and the second sidewall S2 of the first engaging element 212 are located at the same side of the first surface 211a of the first lateral plate 211. Due to the connection between the first sidewall S1 and the second sidewall S2, the first engaging element 212 is concavely formed in the first lateral plate 211, and the dent 213 is formed between the first lateral plate 211 and the first engaging element 212. Preferably, the first engaging element 212 is integrally formed with the first lateral plate 211. In some embodiments, the first slab 2121, the first sidewall S1, and the second sidewall S2 of the first engaging element 212 are produced by stamping the material of the first lateral plate 211 along an outer direction of the first surface 211a.

Please refer to FIG. 4. The second casing 22 comprises the second lateral plate 221 and the second engaging element 222. The second lateral plate 221 comprises a third surface 221a and a fourth surface 221b. The third surface 221a and the fourth surface 221b are opposed to each other. The second lateral plate 221 has a thickness T2. The second engaging element 222 comprises the second slab 2221, the third sidewall S3, and the fourth sidewall S4. Moreover, the second slab 2221 is substantially a flat plate. The thickness T2' of the second slab 2221 is substantially equal to the thickness T2 of the second lateral plate 221. The length and the width of the second slab 2221 match the length and the width of the first slab 2121, respectively. It is preferred that the second slab 2221 is in parallel with the second lateral plate 221. Moreover, the shape and the size of the second slab 2221 match the shape and the size of the first slab 2121. In this embodiment, the second slab 2221 of the second engaging element 222 is a rectangular slab with a fifth edge L5, a sixth edge L6, a seventh edge L7 and an eighth edge L8. The fifth edge L5 and the sixth edge L6 are located beside each other. The seventh edge L7 is opposed to the fifth edge L5. The eighth edge L8 is opposed to the sixth edge L6. It is noted that the shape of the second slab 2221 is not restricted.

The third sidewall S3 and the fourth sidewall S4 of the second engaging element 222 are located beside each other. In addition, the height h2 of the third sidewall S3 is equal to the height h2 of the fourth sidewall S4. The third sidewall S3 and the fourth sidewall S4 are extended from the two adjacent edges L5 and L6 of the second slab 2221 and connected with the second lateral plate 221. Moreover, the third sidewall S3 and the fourth sidewall S4 are extended toward the third surface 221a of the second lateral plate 221. Due to the connection between the third sidewall S3 and the fourth sidewall S4, the second engaging element 222 is protruded from the second lateral plate 221. Preferably, the second engaging element 222 is integrally formed with the second lateral plate 221. In some embodiments, the second slab 2221, the third sidewall S3 and the fourth sidewall S4 of the second engaging element 222 are produced by stamping the material of the second lateral plate 221 along an outer direction of the third surface 221a.

In this embodiment, the height h1 of each of the first sidewall S1 and the second sidewall S2 of the first engaging element 212 is substantially equal to or larger than (i.e. no less than) the thickness T2 of the second lateral plate 221, and the height h2 of each of the third sidewall S3 and the fourth sidewall S4 of the second engaging element 222 is substantially equal to or larger than (i.e. no less than) the thickness T1 of the first lateral plate 211. As mentioned above, the thickness T1' of the first slab 2121 is substantially equal to the thickness T1 of the first lateral plate 211, and the thickness T2' of the second slab 2221 is substantially equal to the thickness T2 of the second lateral plate 221. In other words, the height h1 of the first sidewall S1 and the height h1 of the second sidewall S2 are substantially equal to or larger than (i.e. no less than) the thickness T2 of the second lateral plate 221 and the thickness T2' of the second slab 2221. The height h2 of the third sidewall S3 and the height h2 of the fourth sidewall S4 are substantially equal to or larger than (i.e. no less than) the thickness T1 of the first lateral plate 211 and the thickness T1' of the first slab 2121.

In some embodiments, a first opening 2111 is formed in the first lateral plate 211. The first opening 2111 is arranged beside the first engaging element 212 and used for assisting in the engagement between the first engaging element 212 and the second engaging element 222. In this embodiment, the first opening 2111 is a rectangular opening and located beside the fourth edge L4 of the first slab 2121. Moreover, a second opening 2211 is formed in the second lateral plate 221. The second opening 2211 is located beside the second engaging element 222. The shape and the size of the second opening 2211 match the size and the shape of the first slab 2121. In this embodiment, the second opening 2211 is located beside the eighth edge L8 of the second slab 2221. The second opening 2211 is also a rectangular opening. It is preferred that the size of the second opening 2211 is slightly larger than the first slab 2121.

Please refer to FIGS. 2A, 2B, 3 and 4. For combining the first casing 21 with the second casing 22, the second engaging element 222 is firstly inserted through the first opening 2111. Meanwhile, the first surface 211a of the first lateral plate 211 is in contact with the third surface 221a of the second lateral plate 221. Then, the second casing 22 is moved in the direction parallel with the first lateral plate 211 of the first casing 21, so that the second engaging element 222 is introduced into the dent 213 along the direction parallel with the first lateral plate 211. Until the fourth edge L4 of the first engaging element 212 is in contact with the fourth sidewall S4 of the second engaging element 222 and the eighth edge L8 of the second engaging element 222 is in contact with the second sidewall S2 of the first engaging element 212, the process of assembling the first casing 21 with the second casing 22 is completed. The resulting structure of the casing assembly 2 is shown in FIG. 2B.

In this embodiment, the shape of the first slab 2121 of the first engaging element 212 is substantially identical to the shape of the second slab 2221 of the second engaging element 222. After the first engaging element 212 and the second engaging element 222 are engaged with each other, the first slab 2121 of the first engaging element 212 is in contact with the second slab 2221 of the second engaging element 222. Consequently, the movement of the first casing 21 and the second casing 22 along the normal line direction of the first lateral plate 211 and the second lateral plate 221 will be restricted. At the same time, the third edge L3 of the first engaging element 212 is in contact with the third sidewall S3 of the second engaging element 222, and the seventh edge L7 of the second engaging element 222 is in contact with the first sidewall S1 of the first engaging element 212. Consequently, the movement of the first casing 21 toward the third sidewall S3 and the movement of the second casing 22 toward the first sidewall S1 will be restricted. In other words, the arrangement of the first engaging element 212 and the second engaging element 222 may restrict the movement of the first casing 21 and the second casing 22 along both of the vertical direction and the horizontal direction. Under this circumstance, the number of screws that are used to combine the first casing 21 and the second casing 22 will be reduced. Moreover, since two sidewalls of the first engaging element 212 and two sidewalls of the second engaging element 222 are in connect with the first casing 21 and the second casing 22, the structural strength of the casing assembly 2 is strong enough to withstand the deformation.

Figure 5:
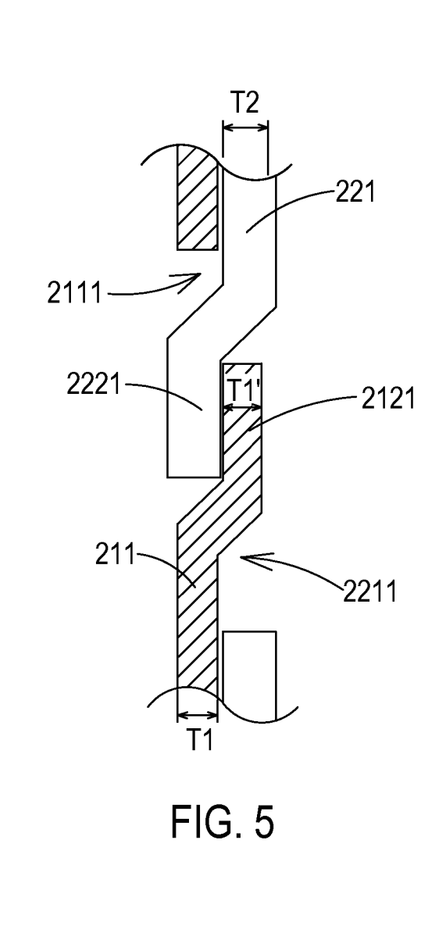
FIG. 5 is a schematic cross-sectional view illustrating the casing assembly of FIG. 2B and taken along the line B-B'.

FIG. 5 is a schematic cross-sectional view illustrating the casing assembly of FIG. 2B and taken along the line B-B'. As shown in FIGS. 3, 4 and 5, after the first casing 21 and the second casing 22 are combined together, the first slab 2121 of the first engaging element 212 is in contact with the second slab 2221 of the second engaging element 222. As mentioned above, the height h1 of the first sidewall S1 and the height h1 of the second sidewall S2 are substantially equal to or larger than (i.e. no less than) the thickness T2 of the second lateral plate 221 and the thickness T2' of the second slab 2221, and the height h2 of the third sidewall S3 and the height h2 of the fourth sidewall S4 are substantially equal to or larger than (i.e. no less than) the thickness T1 of the first lateral plate 211 and the thickness T1' of the first slab 2121. Consequently, after the first engaging element 212 and the second engaging element 222 are engaged with each other, the overall thickness is substantially equal to the sum of the thickness T1 of the first lateral plate 211 and the thickness T2 of the second lateral plate 221. After the first casing 21 and the second casing 22 are combined together, the thickness of the junction between the first engaging element 212 and the second engaging element 222 is about two times the thickness of the first lateral plate 211 or the second lateral plate 221. Consequently, the inner space for accommodating the electronic components and the circuit board is increased. Since the space utilization of the casing assembly 2 is enhanced, the volume of the electronic device can be effectively reduced.

Figure 6:
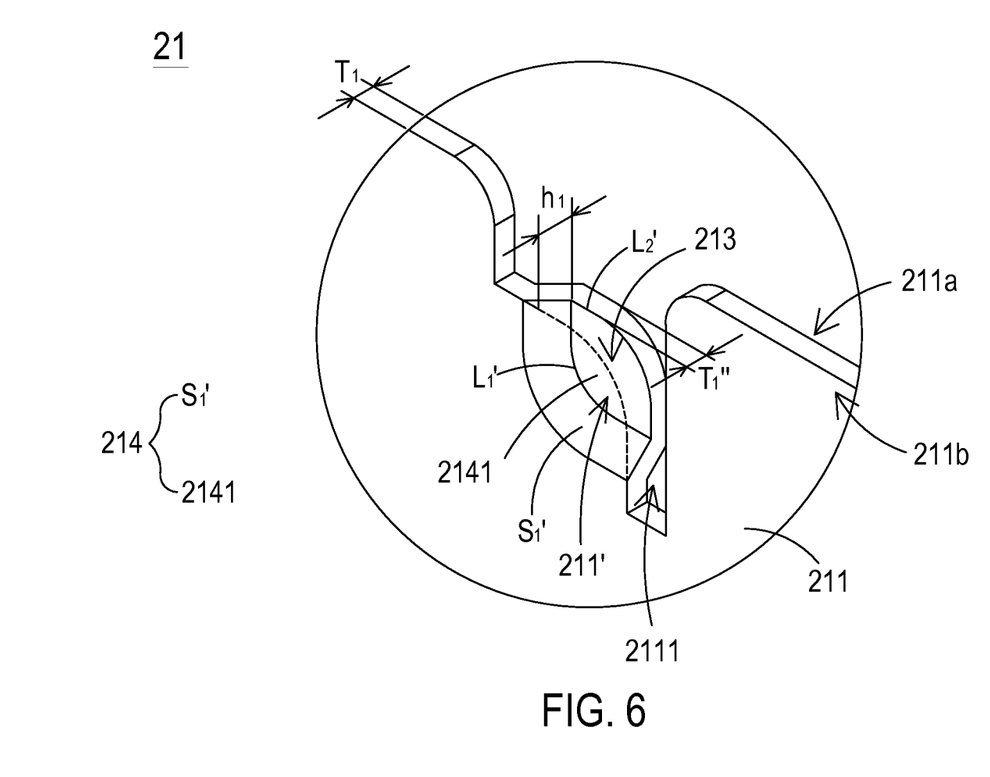
FIG. 6 is an enlarged fragmentary view illustrating another exemplary first engaging element of the casing assembly.
Figure 7:
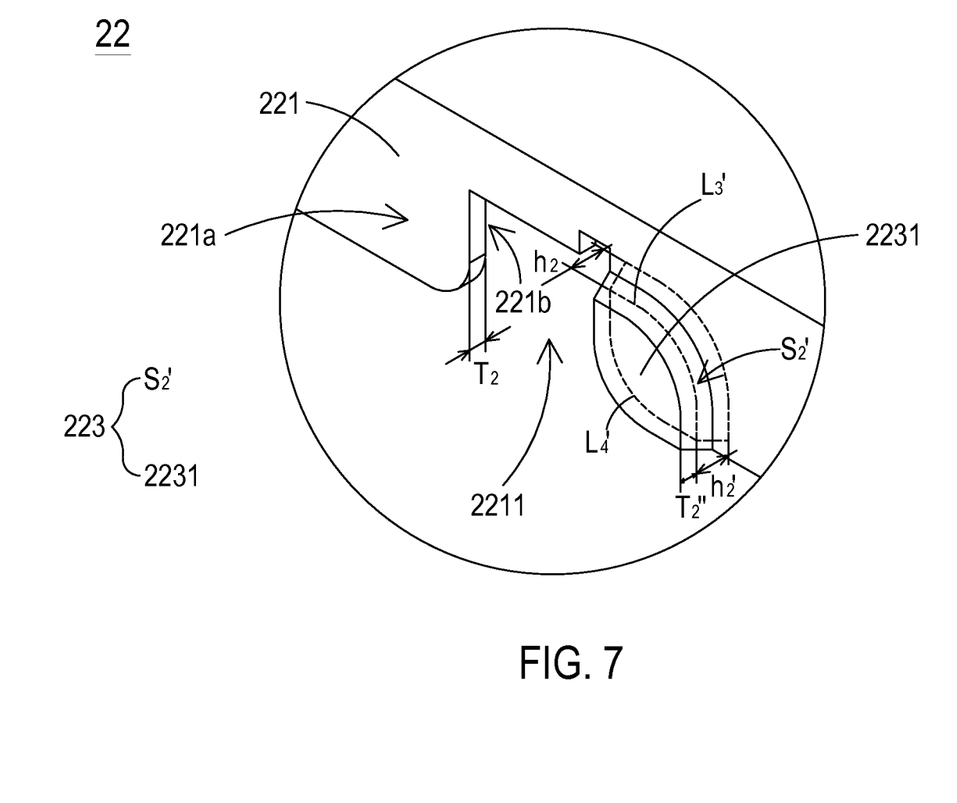
FIG. 7 is an enlarged fragmentary view illustrating another exemplary second engaging element of the casing assembly.

FIG. 6 is an enlarged fragmentary view illustrating another exemplary first engaging element of the casing assembly. FIG. 7 is an enlarged fragmentary view illustrating another exemplary second engaging element of the casing assembly. Component parts and elements corresponding to those of the above embodiment are designated by identical numeral references, and detailed descriptions thereof are omitted. In comparison with the casing assembly of the above embodiment, the first engaging element 214 and the second engaging element 223 are distinguished. The first engaging element 214 comprises a first slab 2141 and a first sidewall S1'. The first slab 2141 comprises a first edge L1' and a second edge L2'. The first edge L1' and the second edge L2' are opposed to each other. In this embodiment, the first sidewall S1' is a curvy sidewall. Moreover, the first sidewall S1' is extended from the first edge L1' of the first slab 2141 toward the first surface 211a of the first lateral plate 211 and connected with the first lateral plate 211. Consequently, the first engaging element 214 is concavely formed in the first lateral plate 211 through the first sidewall S1'.

The second engaging element 223 comprises a second slab 2231 and a second sidewall S2'. The second slab 2231 comprises a third edge L3' and a fourth edge L4'. The third edge L3' and the fourth edge L4' are opposed to each other. In this embodiment, the second sidewall S2' is a curvy sidewall. Moreover, the second sidewall S2' is extended from the third edge L3' of the second slab 2231 toward the third surface 221a of the second lateral plate 221 and connected with the second lateral plate 221. Consequently, the second engaging element 223 is protruded from the second lateral plate 221 through the second sidewall S2'.

In this embodiment, the first engaging element 214 is integrally formed with the first lateral plate 211, but is not limited thereto. The thickness T1" of the first slab 2141 is substantially equal to the thickness T1 of the first lateral plate 211, and the height h2' of the second sidewall S2' are substantially equal to or larger than (i.e. no less than) the thickness T1" of the first slab 2141 and the thickness T1 of the first lateral plate 211. Moreover, the second edge L2' of the first slab 2141 is a curvy edge with a radian corresponding to the radian of the second sidewall S2'. Similarly, the second engaging element 223 is integrally formed with the second lateral plate 221, but is not limited thereto. The thickness T2" of the second slab 2231 is substantially equal to the thickness T2 of the second lateral plate 221, and the height h1' of the first sidewall S1' are substantially equal to or larger than (i.e. no less than) the thickness T2" of the second slab 2231 and the thickness T2 of the second lateral plate 221. Moreover, the fourth edge L4' of the second slab 2231 is a curvy edge with a radian corresponding to the radian of the first sidewall S1'.

After the first casing 21 and the second casing 22 are combined together, the second engaging element 223 is accommodated within the dent 213 between the first lateral plate 211 and the first engaging element 214. Under this circumstance, the first slab 2141 of the first engaging element 214 is in contact with the second slab 2231 of the second engaging element 223. Consequently, the movement of the first casing 21 and the second casing 22 along the normal line direction of the first lateral plate 211 and the second lateral plate 221 will be restricted. At the same time, the second edge L2' of the first engaging element 214 is in contact with the second sidewall S2' of the second engaging element 223, and the fourth edge L4' of the second engaging element 223 is in contact with the first sidewall S1' of the first engaging element 214. Consequently, the movement of the first casing 21 toward the second sidewall S2' and the movement of the second casing 22 toward the first sidewall S1' will be restricted. After the first engaging element 214 and the second engaging element 223 are engaged with each other, the overall thickness is substantially equal to the sum of the thickness T1 of the first lateral plate 211 and the thickness T2 of the second lateral plate 221. After the first casing 21 and the second casing 22 are combined together, the thickness of the junction between the first engaging element 214 and the second engaging element 223 is about two times the thickness of the first lateral plate 211 or the second lateral plate 221.

Figure 8:
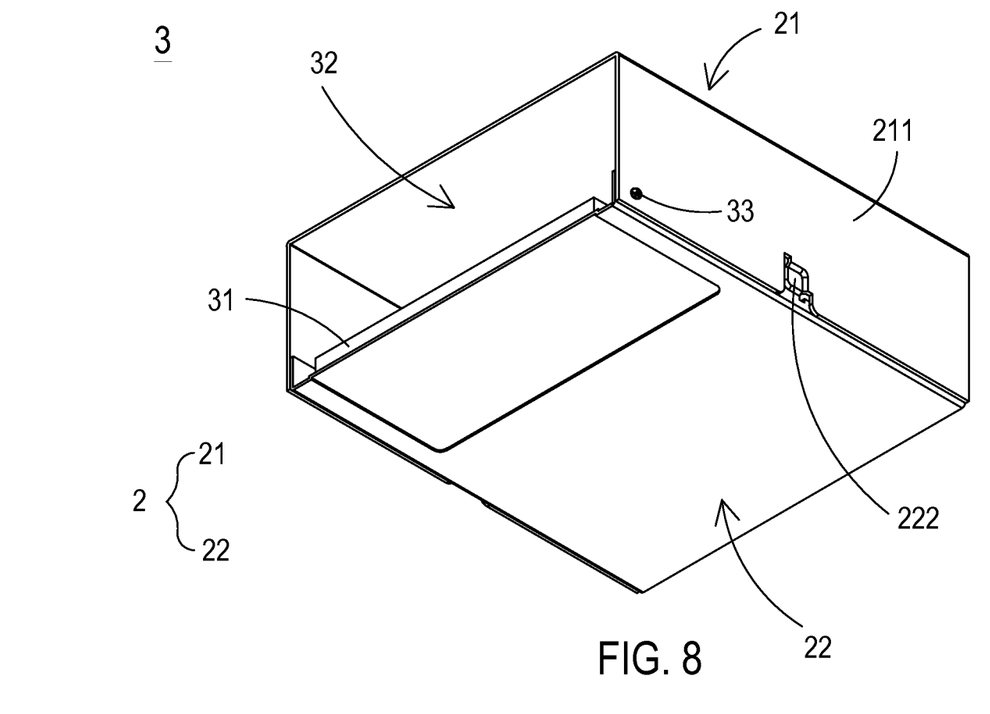
FIG. 8 is a schematic perspective view illustrating a power supply apparatus according to an embodiment of the present application.

FIG. 8 is a schematic perspective view illustrating a power supply apparatus according to an embodiment of the present application. In some embodiment, the casing assembly 2 of the present invention may be applied to a power supply apparatus 3. That is, the power supply apparatus comprises the casing assembly 2 and a circuit board 31. The circuit board is disposed and accommodated within an accommodation space 32 of the casing assembly 2. In an embodiment, the first casing 21 is a box, and the second casing 22 is a plate. After the first engaging element 212 and the second engaging element 222 are engaged with each other and a fastening element 33 (i.e. screw) is employed to secure the first casing 11 and the second casing 12, the first casing 21 and the second casing 22 are combined together. In some embodiment, the first casing 21 and the second casing aren't limited to the box and the plate. It is noted that the structures of the first casing 21 and the second casing 22 may be varied according to the practical requirements.

From the above descriptions, the present invention provides a casing assembly. The casing assembly comprises a first casing and a second casing. The first casing comprises a first lateral plate and a first engaging element. The second casing comprises a second lateral plate and a second engaging element. The arrangement of the first engaging element and the second engaging element may restrict the movement of the first casing and the second casing along both of the vertical direction and the horizontal direction. Consequently, the number of screws for combining the first casing and the second casing is reduced, and the assembling process is simplified. Moreover, the ways of connecting the first engaging element and the second engaging element with the first casing and the second casing may provide sufficient structural strength to withstand the deformation. Moreover, after the first casing and the second casing are combined together, the thickness of the junction between the first engaging element and the second engaging element is about two times the thickness of the first lateral plate or the second lateral plate. Since the space utilization of the casing assembly is enhanced, the volume of the electronic device can be effectively reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A casing assembly, comprising:
   a first casing comprising:
      a first lateral plate; and
      a first engaging element comprising a first slab, a first sidewall and a second sidewall, wherein the first sidewall and the second sidewall are connected with the first lateral plate, and a dent is formed between the first lateral plate and the first engaging element; and
   a second casing combined with the first casing, and comprising:
      a second lateral plate; and
      a second engaging element comprising a second slab, a third sidewall and a fourth sidewall, wherein the third sidewall and the fourth sidewall are connected with the second lateral plate,
   wherein the second engaging element is accommodated within the dent and in contact with the first engaging element, so that the first casing and the second casing are combined together.

2. The casing assembly according to claim 1, wherein the first engaging element is concavely formed in the first lateral plate, the first sidewall and the second sidewall are extended from two adjacent edges of the first slab and connected with the first lateral plate, the second engaging element is protruded from the second lateral plate, and the third sidewall and the fourth sidewall are extended from two adjacent edges of the second slab and connected with the second lateral plate.

3. The casing assembly according to claim 2, wherein the first lateral plate comprises a first surface and a second surface opposed to the first surface, and the first engaging element is concavely formed in the first surface of the first lateral plate, wherein the second lateral plate comprises a third surface and a fourth surface opposed to the third surface, and the second engaging element is protruded from the third surface of the second lateral plate.

4. The casing assembly according to claim 2, wherein the first slab comprises a first edge and a second edge beside the first edge, and the first sidewall and the second sidewall are extended from the first edge and the second edge, respectively, wherein the second slab comprises a fifth edge and a sixth edge beside the fifth edge, and the third sidewall and the fourth sidewall are extended from the fifth edge and the sixth edge, respectively.

5. The casing assembly according to claim 4, wherein the first slab further comprises a third edge and a fourth edge, the third edge is opposed to the first edge, and the fourth edge is opposed to the second edge, wherein the second slab further comprises a seventh edge and an eighth edge, the seventh edge is opposed to the fifth edge, and the eighth edge is opposed to the sixth edge, wherein the third edge is in contact with the third sidewall to restrict movement of the first casing toward the third sidewall, and the seventh edge is in contact with the first sidewall to restrict movement of the second casing toward the first sidewall.

6. The casing assembly according to claim 5, wherein the first lateral plate has a first opening, the first opening is arranged beside the first engaging element and located beside the fourth edge of the first slab, wherein the second lateral plate has a second opening, the second opening is located beside the eighth edge of the second slab.

7. The casing assembly according to claim 6, wherein a shape of the second opening matches a shape of the first slab, and the second opening is slightly larger than the first slab.

8. The casing assembly according to claim 1, wherein the first slab of the first engaging element is in parallel with the first lateral plate, and the second slab of the second engaging element is in parallel with the second lateral plate.

9. The casing assembly according to claim 1, wherein a length and a width of the first slab match a length and a width of the second slab, respectively.

10. The casing assembly according to claim 1, wherein a height of the first sidewall and a height of the second sidewall are no less than a thickness of the second lateral plate and a thickness of the second slab, and a height of the third sidewall and a height of the fourth sidewall are no less than a thickness of the first lateral plate and a thickness of the first slab.

11. The casing assembly according to claim 1, wherein the first slab and the second slab are rectangular slabs.

12. The casing assembly according to claim 1, wherein the first engaging element is integrally formed with the first lateral plate, and the second engaging element is integrally with the second lateral plate.

13. A casing assembly, comprising:
   a first casing comprising:
      a first lateral plate; and
      a first engaging element concavely formed in the first lateral plate and comprising a first slab and at least one first sidewall, wherein the first sidewall is extended from the first slab and connected with the first lateral plate, and a dent is formed between the first lateral plate and the first engaging element; and
   a second casing combined with the first casing and comprising:
      a second lateral plate; and
      a second engaging element protruded from the second lateral plate and comprising a second slab and at least one second sidewall, wherein the second sidewall is extended from the second slab and connected with the second lateral plate,
   wherein the second engaging element is accommodated within the dent and in contact with the first engaging element, so that the first casing and the second casing are combined together.

14. The casing assembly according to claim 13, wherein the first lateral plate comprises a first surface and a second surface opposed to the first surface, and the first engaging element is concavely formed in the first surface of the first lateral plate, wherein the second lateral plate comprises a third surface and a fourth surface opposed to the third surface, and the second engaging element is protruded from the third surface of the second lateral plate.

15. The casing assembly according to claim 13, wherein the first sidewall and the second sidewall are curvy sidewalls, wherein the first slab comprises a first edge, and the first sidewall is extended from the first edge, wherein the second slab comprises a third edge, and the second sidewall is extended from the third edge.

16. The casing assembly according to claim 15, wherein the first slab further comprises a second edge opposed to the first edge, and the second edge has a radian corresponding to the second sidewall, wherein the second slab further comprises a fourth edge opposed to the third edge, and the fourth edge has a radian corresponding to the first sidewall.

17. The casing assembly according to claim 16, wherein the second edge is in contact with the second sidewall to restrict movement of the first casing toward the second sidewall, and the fourth edge is in contact with the first sidewall to restrict movement of the second casing toward the first sidewall.

18. The casing assembly according to claim 13, wherein the first slab of the first engaging element is in parallel with the first lateral plate, and the second slab of the second engaging element is in parallel with the second lateral plate.

19. The casing assembly according to claim 13, wherein a height of the first sidewall is no less than a thickness of the second lateral plate and a thickness of the second slab, and a height of the second sidewall is no less than a thickness of the first lateral plate and a thickness of the first slab.

20. A power supply apparatus, comprising:
 a circuit board; and
 a casing assembly having an accommodation space for accommodating the circuit board, wherein the casing assembly comprises:
  a first casing comprising:
   a first lateral plate; and
   a first engaging element comprising a first slab, a first sidewall and a second sidewall, wherein the first sidewall and the second sidewall are connected with the first lateral plate, and a dent is formed between the first lateral plate and the first engaging element; and
 a second casing combined with the first casing and comprising:
  a second lateral plate; and
  a second engaging element comprising a second slab, a third sidewall and a fourth sidewall, wherein the third sidewall and the fourth sidewall are connected with the second lateral plate,
 wherein the second engaging element is accommodated within the dent and in contact with the first engaging element, so that the first casing and the second casing are combined together.

\* \* \* \* \*